(12) United States Patent
Chen et al.

(10) Patent No.: US 6,593,205 B1
(45) Date of Patent: Jul. 15, 2003

(54) PATTERNED SOI BY FORMATION AND ANNIHILATION OF BURIED OXIDE REGIONS DURING PROCESSING

(75) Inventors: Tze-chiang Chen, Yorktown Heights, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/080,804

(22) Filed: Feb. 21, 2002

(51) Int. Cl.⁷ .............................................. H01L 21/76
(52) U.S. Cl. ...................... 438/423; 438/440; 438/520; 438/526; 438/528; 438/766
(58) Field of Search ................................. 438/423, 407, 438/409, 440, 520, 526, 404, 528, 766; 257/374

(56) References Cited

U.S. PATENT DOCUMENTS 5,702,957 A * 12/1997 Padmanabhan ............. 438/262
6,222,253 B1 * 4/2001 Sadna et al. ................ 257/617
6,300,218 B1 * 10/2001 Cohen et al. ............... 438/423

* cited by examiner

*Primary Examiner*—Olik Chaudhuri
*Assistant Examiner*—Hsien-Ming Lee
(74) *Attorney, Agent, or Firm*—Scully, Scott, Murphy & Presser; Robert M. Trepp

(57) ABSTRACT

A method of fabricating a silicon-on-insulator (SOI) substrate including at least one patterned buried oxide region having well defined edges is provided. The method includes a step of implanting first ions into a surface of a Si-containing substrate so as to form an implant region of the first ions in the Si-containing substrate. Following the first implant step, a selective implant process is employed wherein second ions that are insoluble in $SiO_2$ are incorporated into portions of the Si-containing substrate. The second ions employed in the selective implant step are capable of preventing the implant region of first ions from forming an oxide region during a subsequent annealing step. An annealing step is then performed which causes formation of a buried oxide region in the implant region of first ions that does not include the second ions.

36 Claims, 4 Drawing Sheets

PATTERNED SOI BY FORMATION AND ANNIHILATION OF BURIED OXIDE REGIONS DURING PROCESSING

DESCRIPTION

Field of the Invention

The present invention relates to silicon-on-insulator (SOI) substrates for semiconductor integrated circuits (ICs), and more particularly to a method of fabricating an SOI substrate which includes at least one patterned buried oxide (BOX) region which has well defined edges that are suitable for sub-micron geometries.

Background of the Invention

Separation by implantation of oxygen (SIMOX) is a technique employed in the semiconductor industry in fabricating SOI substrates that can be used in the manufacturing of ICs. SIMOX typically involves using high-energy ions to implant a large dose of oxygen ions beneath the surface of a bulk Si-containing wafer. Upon high-temperature annealing, the implanted oxygen ions form a continuous BOX region which electrically isolates the Si at the surface (i.e., superficial Si layer). Typically, prior art SIMOX processes have been used to fabricate SOIs with a superficial Si layer and a BOX thickness of several thousand angstroms.

In some applications, it is desirable to form discrete and isolated BOX regions within a Si-containing substrate while not forming BOX regions in other portions of the same Si-containing substrate. Hence, there is a growing need for providing patterned SOI regions. Patterned SOI regions formed within a Si-containing substrate are especially needed for future high performance Si-containing ICs, optical communication devices and three-dimensional device and circuit integration.

Despite this need, there are many challenges in fabricating patterned SOI regions within a Si-containing substrate. For example, the following criteria needs to be met:

(i) maintaining a smooth surface topology between the patterned and unpatterned regions;

(ii) controlling and eliminating crystallographic defects at the edge of the mask used during ion implantation to create patterned regions; and (iii) controlling and eliminating crystal defects between the nearby buried oxide islands.

In addition to the above criteria, it is necessary for future generation of ICs to provide SOI substrates that have very fine geometries (on the order of a micron or less) associated therewith. In particular, fine geometries are needed in some applications especially in instances wherein the buried oxide region is employed as a diffusion barrier for most dopants in Si. A BOX region under a gate and extension regions of a field effect transistor (FET) also suppresses the infringing field from the drain region during high operating voltages.

In view of the above, there is a continued need for providing a new and improved method of fabricating SOI substrates that have at least one patterned buried oxide (BOX) region which has well defined edges that are suitable for sub-micron geometries.

SUMMARY OF THE INVENTION

One object of the present invention is to provide a method of forming at least one patterned BOX, i.e., at least one discrete and isolated oxide island, within a Si-containing substrate.

Another object of the present invention is to provide a method of forming at least one patterned BOX region within a Si-containing substrate wherein the at least one patterned BOX region has well defined edges that are suitable for sub-micron geometries. The term "well defined" is used herein to denote a BOX region whose edges are substantially smooth and free of crystal defects.

A further object of the present invention is to provide a method of forming at least one patterned BOX region within a Si-containing substrate wherein the method essentially controls and eliminates crystal defects between nearby oxide islands, i.e., between the discrete buried oxide (BOX) regions.

A still further object of the present invention is to provide a method of forming an SOI substrate having at least one patterned BOX region which extends the scalability of complementary metal oxide semiconductor (CMOS) devices to 0.05–0.1 micron channel lengths.

These and other objects and advantages are achieved in the present invention by utilizing a method wherein the at least one patterned BOX region is formed utilizing various ion implantation steps which includes at least one ion implantation step that selectively annihilates portions of a previously implanted region.

In accordance with the present invention, the ion implantation step that selectively annihilates portions of a previously implanted region comprises the use of ions that are non-soluble in $SiO_2$. The non-soluble ions function to create damage and a buried chemical environment that prevents the formation of a buried oxide region during a subsequent annealing process.

In broad terms the inventive method comprises the steps of:

(a) implanting first ions into a surface of a Si-containing substrate so as to form an implant region of said first ions in said Si-containing substrate;

(b) selectively implanting second ions that are insoluble in $SiO_2$ into portions of said Si-containing substrate, said second ions are capable of preventing said implant region of first ions from forming an oxide region during a subsequent annealing step; and (c) annealing said Si-containing substrate, wherein said annealing causes formation of a buried oxide region in said implant region of first ions that does not include said second ions.

In one embodiment, the method of the present invention comprises the steps of:

(a) implanting first ions into a surface of a Si-containing substrate so as to form an implant region of said first ions in said Si-containing substrate;

(b) forming a patterned mask on said surface of said Si-containing substrate;

(c) implanting second ions that are insoluble in $SiO_2$ into said Si-containing substrate not containing said patterned mask, said second ions are capable of preventing said implant region of first ions from forming an oxide region during a subsequent annealing step;

(d) removing said patterned mask; and (e) annealing said Si-containing substrate, wherein said annealing causes formation of a buried oxide region in said implant region of first ions that does not include said second ions.

In another embodiment, the method of the present invention comprises the steps of:

(a) implanting first ions into a surface of a Si-containing substrate so as to form an implant region of said first ions in said Si-containing substrate;

(b) forming a patterned mask on said surface of said Si-containing substrate;

(c) implanting second ions that are insoluble in $SiO_2$ into said Si-containing substrate not containing said patterned mask, said second ions are capable of preventing said implant region of first ions from forming an oxide region during a subsequent annealing step;

(d) annealing said Si-containing substrate, wherein said annealing causes formation of a buried oxide region in said implant region of first ions that does not include said second ions; and (e) removing said patterned mask.

DETAILED DESCRIPTION OF THE INVENTION

Figure 1A:
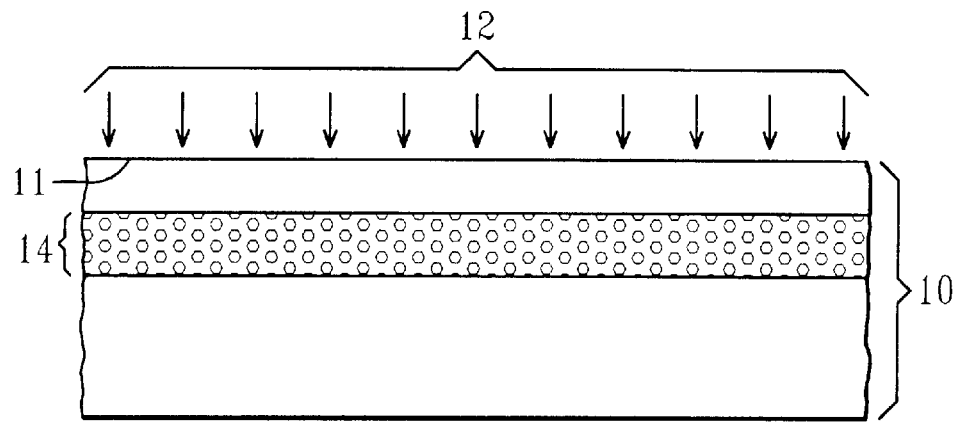
FIG. 1A–1E are pictorial representations (through cross-sectional views) showing the various processing steps employed in one embodiment of the present invention which is used in forming an SOI substrate having at least one patterned BOX region that has well defined edges associated therewith.

The present invention, which provides a method of fabricating an SOI substrate having at least one patterned BOX region formed therein, will now be described in greater detail by referring to the drawings that accompany the present application.

Reference is first made to FIG. 1A–1E which show the various processing steps that are employed in one embodiment of the present invention wherein an SOI substrate having at least one patterned buried oxide region that has well defined edges is fabricated.

Specifically, FIG. 1A illustrates the first processing step of the present invention wherein first ions 12 are implanted into a surface of Si-containing substrate 10 under conditions wherein an implant region of first ions (labeled as 14) is formed within the Si-containing substrate. The first ions may be implanted using a continuous or pulse ion implantation process wherein various doses of first ions 12 can be employed.

The term "Si-containing substrate" as used herein denotes any Si-containing material including, but not limited to: Si, SiGe, SiC, SiCGe, nitrogen doped Si, Si/Si and Si/SiGe. A preferred Si-containing substrate employed in the present invention is a Si wafer. The Si-containing substrate may be undoped or doped (n or p-type) depending on the future use of the SOI wafer.

The first implant step of the present invention wherein first ions 12 are implanted is performed using an ion dosage of from about 3E15 to about 5E17 $cm^{-2}$, with an ion dosage of from about 1E16 to about 1E17 $cm^{-2}$ being more preferred. In addition to using the above range of ion doses, first ions 12 are implanted using an ion implantation apparatus that operates at a beam current density of from about 0.05 to about 500 milliamps $cm^{-2}$ and at an energy of from about 30 to about 1000 keV. More preferably, this implant is carried out using an energy of from about 30 to about 250 keV.

This implant, which may be referred to as a base ion implant, is carried out at a temperature of from about 100° to about 800° C. and at a beam current density of from about 0.05 to about 500 mA $cm^{-2}$. More preferably, the base ion implant may be carried out at a temperature of from about 200° to about 600° C. and at a beam current density of from about 0.5 to about 50 mA $cm^{-2}$.

If desired, the base implant step may be followed by a second implant of said first ions that is carried out using an ion dose of from about 1E13 to about 1E17 $cm^{-2}$, with an ion dose of from about 1E14 to about 1E16 $cm^{-2}$ being more highly preferred. The second ion implant is carried out at an energy of from about 1 to about 1000 keV, with an energy of from about 30 to about 500 keV being more preferred.

This second implant is performed at a temperature of from about 4 K to about 800° C. and a beam current density of from about 0.05 to about 500 mA $cm^{-2}$. More preferably, the second implant of said first ions may be performed at a temperature of from about –20° to about 200° C. and a beam current density of from about 0.05 to about 20 mA $cm^{-2}$.

Suitable first ions that are employed in the present invention include any ions that are soluble in silicon and which are capable of forming a damaged region within the Si-containing substrate that can be subsequently converted into a buried oxide region upon subjecting the same to high temperature annealing (on the order of about 1000° C. or above). Illustrative examples of such first ions include, but are not limited to: oxygen, nitrogen and any combination including mixtures thereof. Of the various first ions mentioned above, it is highly preferred in the present invention to use oxygen as the first ions.

When oxygen is employed as the first ions, it is highly preferred that the oxygen ions (first ions 12) be implanted using the following conditions:

(I) First dose of oxygen: Oxygen dosage of from about 3E15 to about 5E17 $cm^{-2}$; implant energy of from about 10 to about 400 keV; and temperature of about 23° C. to about 700° C.;

(II) Second dose of oxygen: Oxygen dosage of from about 1E14 to about 1E16 $cm^{-2}$; implant energy of from about 10 to about 400 keV; and temperature of about 4 K to about 473 K;

Notwithstanding the type of first ions employed, the first ions are implanted to an average depth that is from about 15 to about 1000 nm, more preferably from about 100 to about 500 nm, below the uppermost surface (labeled as 11 in the drawings) of the Si-containing substrate.

Figure 1B:
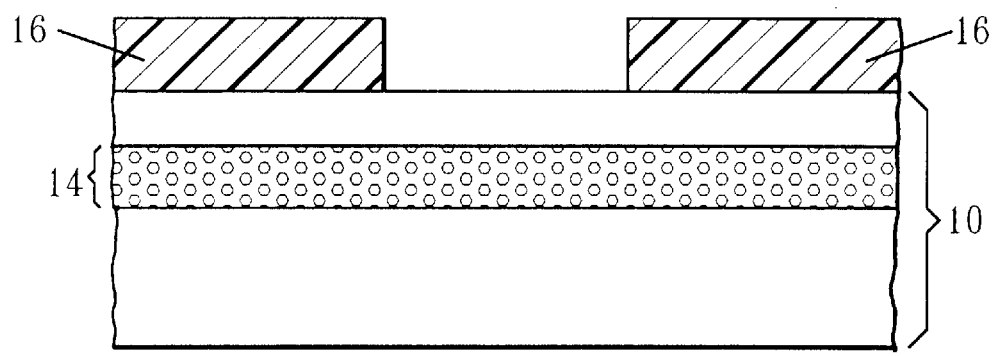

Next, and as shown in FIG. 1B, patterned mask 16 is formed on uppermost surface 11 of Si-containing substrate 10. Patterned mask 16, which serves to protect a portion of the Si-containing substrate, while leaving other portions of the Si-containing substrate unprotected, i.e., exposed, is formed using conventional processes well known in the art. For example, the patterned mask is formed by first providing a layer of mask material, such as a dielectric material, a hardmask, or a polymer (including commercially available photoresists), on the entire surface of the Si-containing substrate. The layer of mask material is formed by a conventional deposition process such as chemical vapor deposition (CVD), plasma-assisted CVD, evaporation, sputtering, spin-on coating, chemical solution deposition, or atomic layer deposition. Alternatively, the layer of mask material may be formed by a thermal growing process.

After forming the layer of mask material on the Si-containing substrate, the resultant structure is then subjected to a conventional lithography step which may include the steps of applying a photoresist to the mask material (this step may be omitted if the mask material is a photoresist), exposing the photoresist to a pattern of radiation, and developing the pattern in the photoresist using a resist developer. In cases wherein the mask material is other than a photoresist, the pattern is then transferred to the mask material by utilizing a conventional dry etching process such as reactive-ion etching, ion beam etching, plasma etching or laser ablation and the photoresist that is formed atop the layer of mask material is removed using a conventional stripping process well known to those skilled in the art.

Figure 1C:
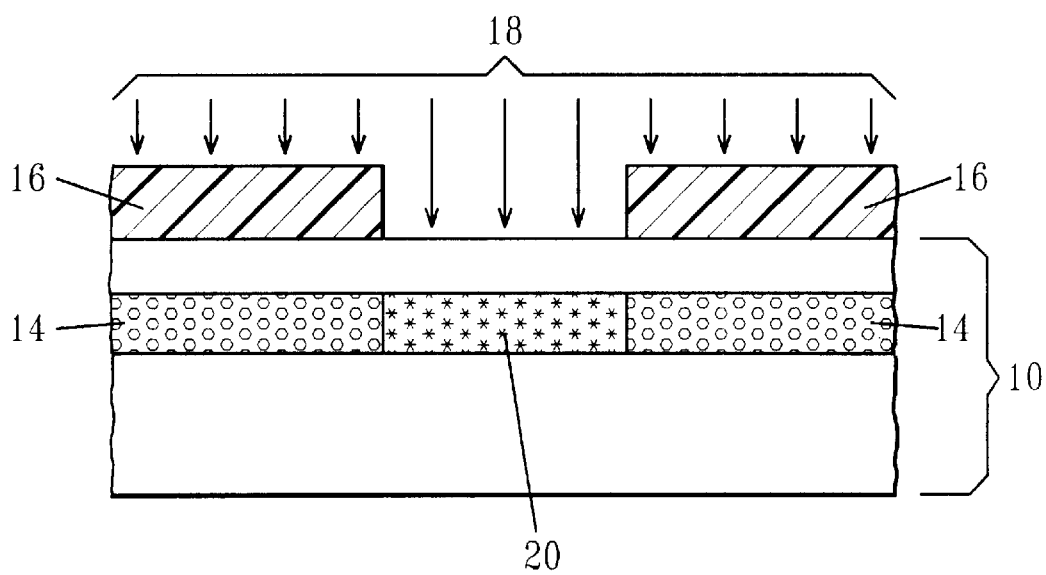

Following the formation of patterned mask 16, second ions 18 that are non-soluble in $SiO_2$ are implanted into the Si-containing substrate not containing said patterned mask, See FIG. 1C. Note that the implanted second ions combine with the previously formed first ions to form implant region 20 which has an intermixture of damage to the lattice structure and first ions 12 and second ions 18. Implant region 20 may be amorphous, a mixture of amorphous and damaged crystalline, or damaged crystalline. Specifically, the second ions are employed in the present invention to selectively annihilate portions of the first implant region, which, if not annihilated, would form an oxide region during a subsequent annealing step.

In accordance with the present invention, second ions 18 are capable of preventing the previously implanted first ions from forming an oxide region in the Si-containing substrate during a subsequent annealing step. Suitable second ions which can be employed in the present invention include, but are not limited to Ge, As, C, N, Sn, S, Ar, Ne, Kr, Xe, Rn, Mo, W, Ta, In, Ag, Au and any combination thereof including alloys. Of the various second ions mentioned above, it is preferred to use Ge or As ions.

The second ions are implanted using a continuous or pulse ion implantation mode. Specifically, the second ions are implanted using an ion dosage from 1E13 to about 1E17 $cm^{-2}$, with an ion dosage of from about 1E14 to about 1E16 $cm^{-2}$ being more preferred. In addition to using the above range of ion doses, second ions 18 are implanted using an ion implantation apparatus that operates at a beam current of from about 0.01 to about 50 milliamps $cm^{-2}$ and at an energy of from about 1 to about 1000 keV. More preferably, this implant is carried out using an energy of from about 10 to about 500 keV.

The second ion implantation step is carried out at a temperature of from about 4 K to about 800° C. and at a beam current density of from about 0.05 to about 500 mA $cm^{-2}$. More preferably, the second ion implant may be carried out at a temperature of from about −20° to about 200° C. and at a beam current density of from about 0.05 to about 20 mA $cm^{-2}$.

Figure 1D:
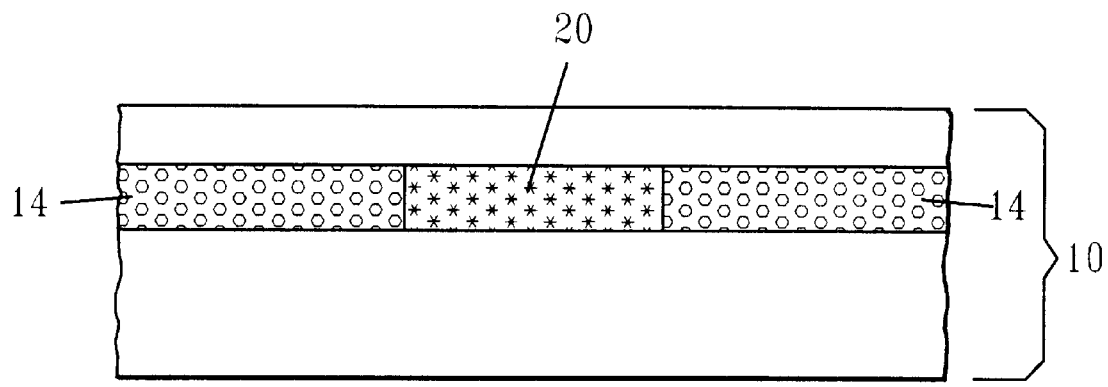

Following the formation of implant region 20 (i.e., region wherein the first ions have been selectively annihilated), patterned mask 16 may be removed providing the structure shown in FIG. 1D. Specifically, the patterned mask is removed at this point of the present invention utilizing a conventional etching process which is highly selective in removing patterned mask as compared with Si-containing substrate 10. Note that in some embodiments of the present invention, as to be discussed in further detail hereinbelow, the patterned mask remains on the surface of the Si-containing substrate during the annealing step.

Following the removal of the patterned mask, the structure shown in FIG 1D is then subjected to an annealing step which is capable of converting remaining first implant regions 14 into buried oxide regions 22, while healing implant region 20 into a crystalline region which substantially matches that of the Si-containing substrate.

Specifically, the annealing step is a high-temperature annealing step which is carried out at a temperature of about 1000° C. or above and in an oxidizing ambient so as to form at least one discrete buried oxide region 22 in said Si-containing substrate. More specifically, the high-temperature annealing is carried out at a temperature of from about 1300° to about 1350° C.

The time period in which annealing is preformed may vary, but typically it is from about 1 to about 100 hours, with an annealing time period of from about 2 to about 24 hours being more highly preferred.

In accordance with the present invention, annealing is carried out in an oxidizing ambient that includes at least one oxygen-containing gas such as $O_2$, NO, $N_2O$, air, ozone or mixtures thereof. The oxidizing ambient may further include at least one inert gas such as He, Ar, $N_2$, Kr, Xe and Ne. More specifically, the oxidizing ambient employed in the present invention comprises from about 0.1 to about 100% oxygen-containing gas and from about 99.9 to about 0% inert gas such as He, Ar, and $N_2$. In one preferred embodiment of the present invention, Ar is employed as the inert gas. More preferably, the annealing step employed in the present invention is carried out in an ambient that includes from about 0.1 to about 50% oxygen-containing gas and from about 50 to about 99.9% inert gas.

The annealing step may be carried out by simply heating the substrate at a specific temperature ramp rate to the targeted temperature, or various ramp and soak cycles may be employed. During the various ramp and soak cycles it is possible to vary the content of the annealing ambient within the ranges mentioned above. The parameters for the ramp and soak cycles are mentioned in U.S. Pat. No. 5,930,643 to Sadana, et al, the entire content of which is incorporated herein by reference. Note that the parameters for the ramp and soak cycles in the '643 patent may be adjusted herein to achieve formation of the inventive SOI substrate. For example, a ramp rate (heating and cooling) of from about 0.1° C./min to about 10° C./min may be employed.

Figure 1E:
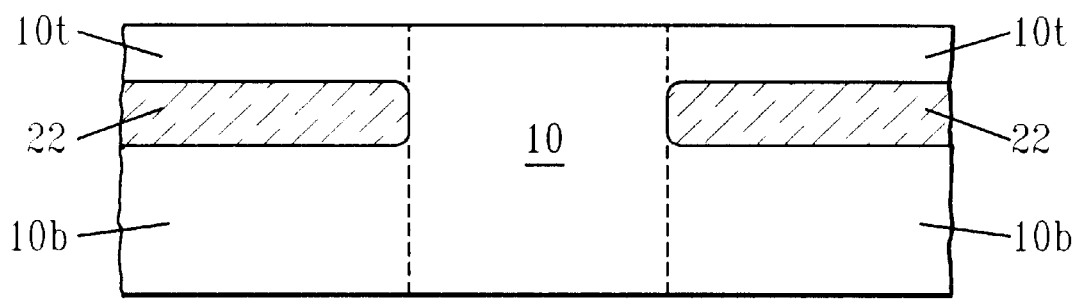

The structure that is formed after annealing is shown in FIG. 1E. Note that BOX region 22 electrically isolates top superficial Si-containing layer 10t from bottom Si-containing layer 10b. The dotted lines are employed to represents the boundaries of these two Si-containing layers. It should be also noted that during the annealing step a surface oxide forms on the surface of the Si-containing substrate. The surface oxide is not shown in these drawings since it is typically removed after annealing using a chemical wet etch process that has a high selectivity for removing oxide as compared with Si.

The thickness of the BOX regions formed in the present invention may vary depending upon the exact embodiment used in fabricating the same. Typically, however, the BOX region of the present invention has a thickness of from about 100 to about 2000 Å, with a thickness of from about 100 to about 1500 Å being more highly preferred. Note that the BOX thickness is a mean value that is based upon a Gaussian distribution curve.

Insofar as the top superficial Si-containing layer is concerned, that Si-containing layer may have a variable thickness which is also dependent upon the exact embodiment used in fabricating the same. Typically, however, the superficial Si-containing layer of the SOI substrate of the present invention has a thickness of from about 100 to about 50000 Å, with a thickness of from about 100 to about 2000 Å being more highly preferred. The thickness of the bottom Si-containing layer is inconsequential to the present invention.

Figure 2A:
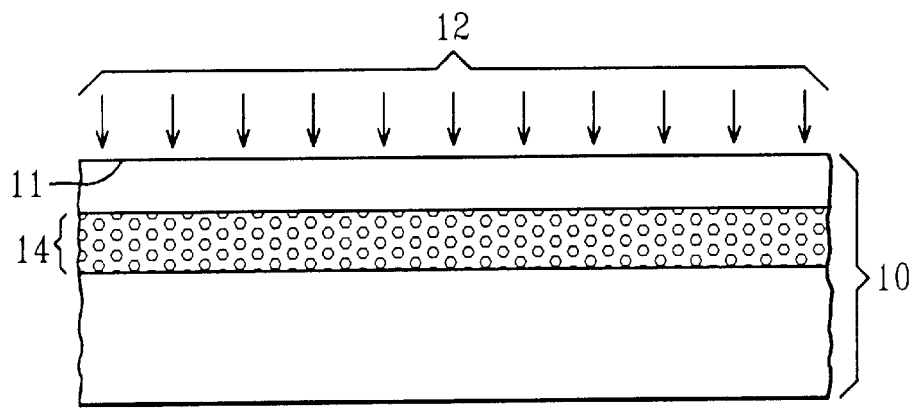
FIGS. 2A–2E are pictorial representations (through cross-sectional views) showing the various processing steps employed in one embodiment of the present invention which is used in forming an SOI substrate having at least one patterned BOX region that has well defined edges associated therewith.
Figure 2B:
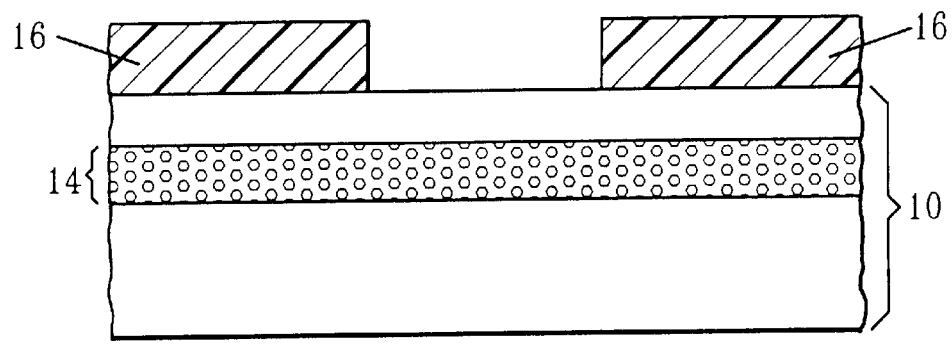
Figure 2C:
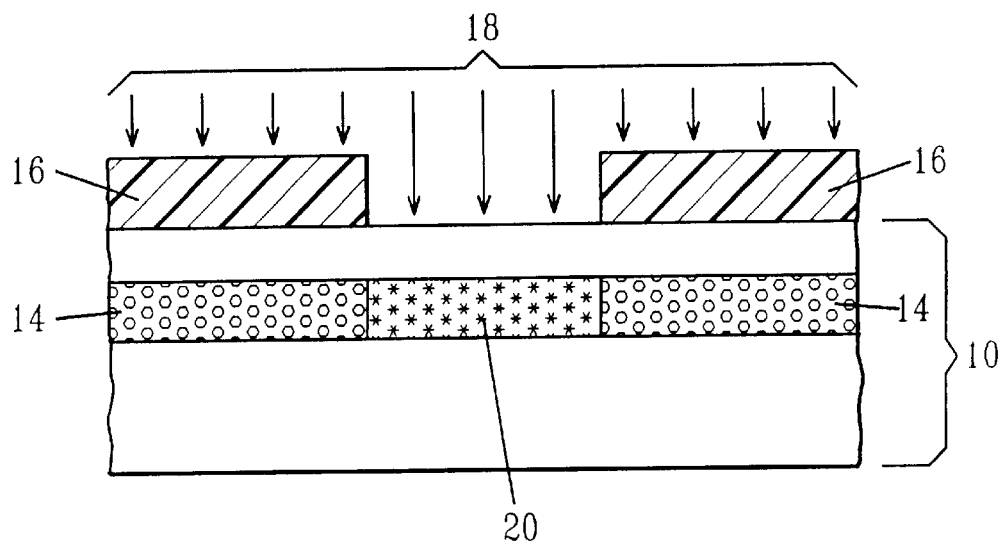
Figure 2D:
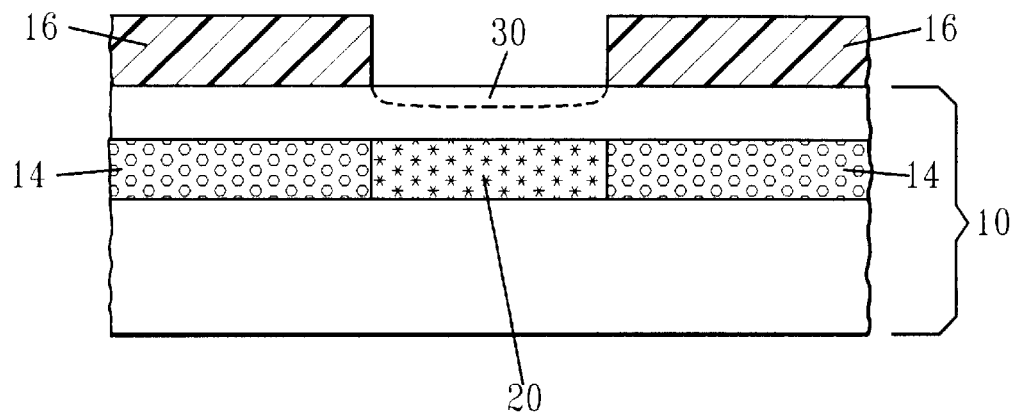
Figure 2E:
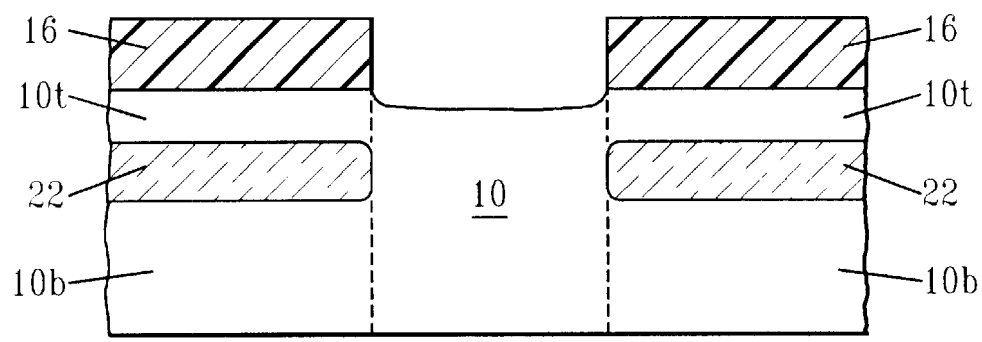

Reference is now made to FIGS. 2A–2E which show another embodiment of the present invention wherein patterned mask 16 remains on the surface of the structure during the annealing step. Since FIGS. 2A–2C are the same as shown in FIGS. 1A–1C no further explanation of those figures is deemed necessary herein. Unlike the previous embodiment wherein the patterned mask was removed from the structure prior to annealing, in this embodiment the patterned mask remains on the structure during the annealing step. The resultant structure after annealing is shown in FIG. 2D. Note that surface areas (labeled as 30) between the patterned mask have been oxidized hence consuming the top surface of the Si-containing substrate. FIG. 2E shows the structure after removal of oxidized surface regions 30. Following removal of the oxidized surface region, the patterned mask may be removed from the structure.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of fabricating a silicon-on-insulator (SOI) substrate comprising at least one patterned buried oxide region having well defined edges, said method comprising the steps of:
   (a) implanting first ions into a surface of a Si-containing substrate so as to form an implant region of said first ions in said Si-containing substrate;
   (b) selectively implanting second ions that are insoluble in $SiO_2$ into portions of the implant region of first ions, said second ions are capable of preventing said implant region of said first ions from forming an oxide region during a subsequent annealing step; and
   (c) annealing said Si-containing substrate, wherein said annealing causes formation of a buried oxide region in said implant region of first ions that does not include said second ions.

2. The method of claim 1 wherein said Si-containing substrate comprises Si, SiGe, SiC, SiCGe, nitrogen doped Si, Si/Si or Si/SiGe.

3. The method of claim 2 wherein said Si-containing substrate comprises a Si wafer.

4. The method of claim 1 wherein said first ions are selected from the group consisting of oxygen, nitrogen and any combination or mixtures.

5. The method of claim 4 wherein said first ions are oxygen ions.

6. The method of claim 1 wherein step (a) is performed using an ion dosage of from about 3E15 to about 5E17 $cm^{-2}$.

7. The method of claim 6 wherein step (a) is performed using an ion dosage of from about 1E16 to about 2E17 $cm^{-2}$.

8. The method of claim 1 wherein step (a) is carried out an energy of from about 30 to about 1000 keV.

9. The method of claim 8 wherein step (a) is carried out an energy of from about 30 to about 250 keV.

10. The method of claim 1 wherein step (a) is performed at a temperature of from about 100° to about 800° C. and at a beam current density of from about 0.05 to about 500 mA $cm^{-2}$.

11. The method of claim 10 wherein step (a) is performed at a temperature of from about 200° to about 600° C. and at a beam current density of from about 0.5 to about 50 mA $cm^{-2}$.

12. The method of claim 1 wherein step (a) is performed using a continuous or pulse ion implantation mode.

13. The method of claim 1 wherein step (a) comprises a base ion implant followed by a second ion implant.

14. The method of claim 13 wherein said second ion implant is performed at an ion dosage of from about 1E13 to about 1E17 $cm^{-2}$.

15. The method of claim 14 wherein said second ion implant is performed using an ion dosage of from about 1E14 to about 1E16 $cm^{-2}$.

16. The method of claim 13 wherein said second ion implant is carried out an energy of from about 1 to about 1000 keV.

17. The method of claim 16 wherein said second ion implant is carried out an energy of from about 30 to about 500 keV.

18. The method of claim 13 wherein said second ion implant is performed at a temperature of from about 4 K to about 800° C. and at a beam current density of from about 0.05 to about 500 mA $cm^{-2}$.

19. The method of claim 1 wherein said first ions are oxygen ions and step (a) is carried out by a first oxygen implant step which is performed at an oxygen dosage of from about 3E15 to about 5E17 $cm^{-2}$, implant energy of from about 10 to about 400 keV, and a temperature of about 23° C. to about 700° C.; and a second oxygen ion implant step which is carried out at an oxygen dosage of from about 1E14 to about 1E16 $cm^{-2}$, implant energy of from about 10 to about 400 keV, and a temperature of about 4 K to about 473 K.

20. The method of claim 1 wherein step (b) includes the use of a patterned mask formed atop said Si-containing substrate.

21. The method of claim 1 wherein said second ions are selected from the group consisting of Ge, As, C, N, Sn, S, Ar, Ne, Kr, Xe, Rn, Mo, W, Ta, In, Ag, Au and any combination or alloy thereof.

22. The method of claim 21 wherein said second ions are Ge or As ions.

23. The method of claim 1 wherein step (b) is performed using an ion dosage of from about 1E13 to about 1E17 $cm^{-2}$.

24. The method of claim 23 wherein step (b) is performed using an ion dosage of from about 1E14 to about 1E16 $cm^{-2}$.

25. The method of claim 1 wherein step (b) is carried out an energy of from about 1 to about 1000 keV.

26. The method of claim 25 wherein step (b) is carried out an energy of from about 10 to about 500 keV.

27. The method of claim 1 wherein step (b) is performed at a temperature of from about 4 K to about 800° C. and at a beam current density of from about 0.05 to about 500 mA $cm^{-2}$.

28. The method of claim 27 wherein step (b) is performed at a temperature of from about −20° to about 200° C. and at a beam current density of from about 0.05 to about 20 mA $cm^{-2}$.

29. The method of claim 1 wherein step (c) is performed at a temperature of about 1000° C. or higher and in an oxidizing ambient.

30. The method of claim 29 wherein step (c) is performed at a temperature of from about 1300° to about 1350° C.

31. The method of claim 29 wherein said oxidizing ambient comprises at least one oxygen-containing gas.

32. The method of claim 31 wherein said oxidizing ambient further comprises an inert gas.

33. The method of claim 29 wherein said oxidizing ambient comprises from about 0.1 to about 99.9% oxygen-containing gas and from about 99.9 to about 0% inert gas.

34. The method of claim 33 wherein said oxidizing ambient comprises from about 0.1 to about 50% oxygen-containing gas and from about 99.9 to about 50% inert gas.

35. A method of fabricating a silicon-on-insulator (SOI) substrate comprising at least one patterned buried oxide region having well defined edges, said method comprising the steps of:

(a) implanting first ions into a surface of a Si-containing substrate said as to form an implant region of said first ions in said Si-containing substrate;

(b) forming a patterned mask on said surface of said Si-containing substrate;

(c) implanting second ions that are insoluble in $SiO_2$ into underlying portions of the implant region of first ions not protected by said patterned mask, said second ions are capable of preventing said implant region of first ions from forming an oxide region during a subsequent annealing step;

(d) removing said patterned mask; and (e) annealing said Si-containing substrate, wherein said annealing causes formation of a buried oxide region in said implant region of first ions that does not contain said second ions.

36. A method of fabricating a silicon-on-insulator (SOI) substrate comprising at least one patterned buried oxide region having well defined edges, said method comprising the steps of (a) implanting first ions into a surface of a Si-containing substrate said as to form an implant region of said first ions in said Si-containing substrate;

(b) forming a patterned mask on said surface of said Si-containing substrate;

(c) implanting second ions that are insoluble in $SiO_2$ into underlying portions of the implant region of first ions not protected by said patterned mask, said second ions are capable of preventing said implant region of first ions from forming an oxide region during a subsequent annealing step;

(d) annealing said Si-containing substrate, wherein said annealing causes formation of a buried oxide region in said implant region of first ions that does not contain said second ions; and (e) removing said patterned mask.

* * * * *